US010490288B1

(12) United States Patent
Wang et al.

(10) Patent No.: US 10,490,288 B1
(45) Date of Patent: Nov. 26, 2019

(54) PAGE-LEVEL REFERENCE VOLTAGE PARAMETERIZATION FOR SOLID STATESOLID STATE STORAGE DEVICES

(71) Applicant: Seagate Technology LLC, Cupertino, CA (US)

(72) Inventors: Zheng Wang, Louisville, CO (US); Ara Patapoutian, Hopkinton, MA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 16/144,655

(22) Filed: Sep. 27, 2018

(51) Int. Cl.
*G11C 16/06* (2006.01)
*G11C 16/28* (2006.01)
*G06F 3/06* (2006.01)
*G11C 16/34* (2006.01)

(52) U.S. Cl.
CPC .............. *G11C 16/28* (2013.01); *G06F 3/061* (2013.01); *G06F 3/0679* (2013.01); *G11C 16/349* (2013.01)

(58) Field of Classification Search
CPC ....... G11C 16/28; G11C 16/349; G06F 3/061; G06F 3/0679
See application file for complete search history.

(56) References Cited

U.S. PATENT DOCUMENTS

| | | | |
|---|---|---|---|
| 8,081,517 B2 * | 12/2011 | Kim .................... | G11C 16/3495 365/185.11 |
| 8,635,509 B2 * | 1/2014 | Choi .................... | G06F 11/1072 714/755 |
| 8,693,257 B2 | 4/2014 | Sridharan et al. | |
| 8,707,104 B1 * | 4/2014 | Jean .................... | G06F 11/1048 714/41 |
| 9,036,413 B2 | 5/2015 | Wu et al. | |

(Continued)

OTHER PUBLICATIONS

Saugata Ghose, "Vulnerabilities in MLC NAND Flash Memory Programming: Experimental Analysis, Exploits, and Mitigation Techniques," https://www.flashmemorysummit.com/English/Collaterals/Proceedings/2017/20170809_S203B_Ghose.pdf.

(Continued)

*Primary Examiner* — Pho M Luu
(74) *Attorney, Agent, or Firm* — Ryan, Mason & Lewis, LLP

(57) ABSTRACT

Page-level reference voltage parameterization techniques are provided for solid state memory devices. A method comprises obtaining a bit error count for a plurality of page numbers across a plurality of blocks of a solid state memory device; determining a substantially optimal reference voltage for each page number that substantially minimizes a corresponding bit error count; collecting, for each reference voltage, page numbers and corresponding substantially optimal reference voltages; and determining, for each reference voltage, a non-linear function that substantially fits a distribution of the collected page numbers and corresponding substantially optimal reference voltages, wherein a given page having a given page number is read using a plurality of parameters of the non-linear function to generate the substantially optimal reference voltage for the given page number. At least one additional page is optionally read using a mean value for the substantially optimal reference voltage for the page number of the additional page.

20 Claims, 11 Drawing Sheets

(56) References Cited

U.S. PATENT DOCUMENTS

| | | |
|---|---|---|
| 9,417,797 B2 | 8/2016 | Chen et al. |
| 2012/0134213 A1 | 5/2012 | Choi et al. |
| 2014/0359202 A1* | 12/2014 | Sun .................. G11C 16/34 711/103 |

OTHER PUBLICATIONS

Haleh Tabrizi et al., "Improving NAND Flash Read Performance Through Learning," 2015 IEEE International Conference on Communications (ICC) (Jun. 8, 2015).

Novotny et al., "NAND Flash Memory Organization and Operations," J Inform Tech Softw Eng., ISSN: 2165-7866 JITSE, an open access journal, vol. 5, Issue 1 (2015).

\* cited by examiner

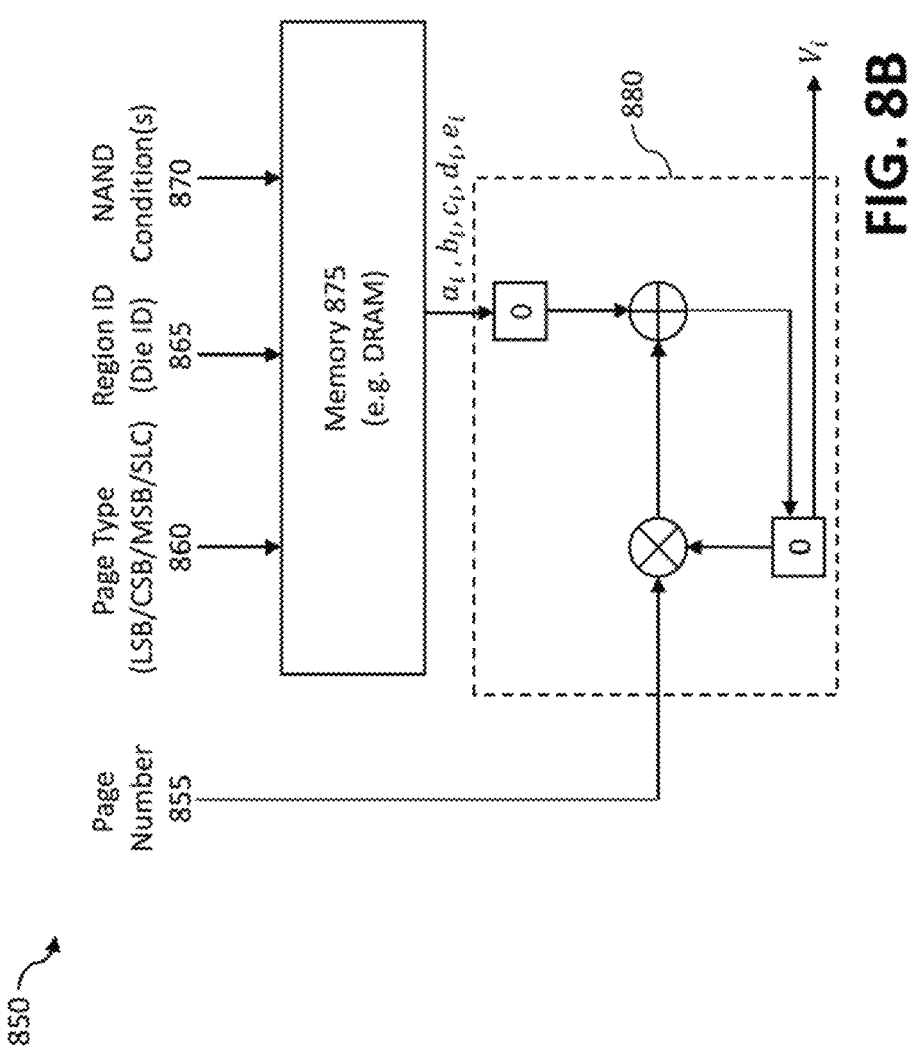

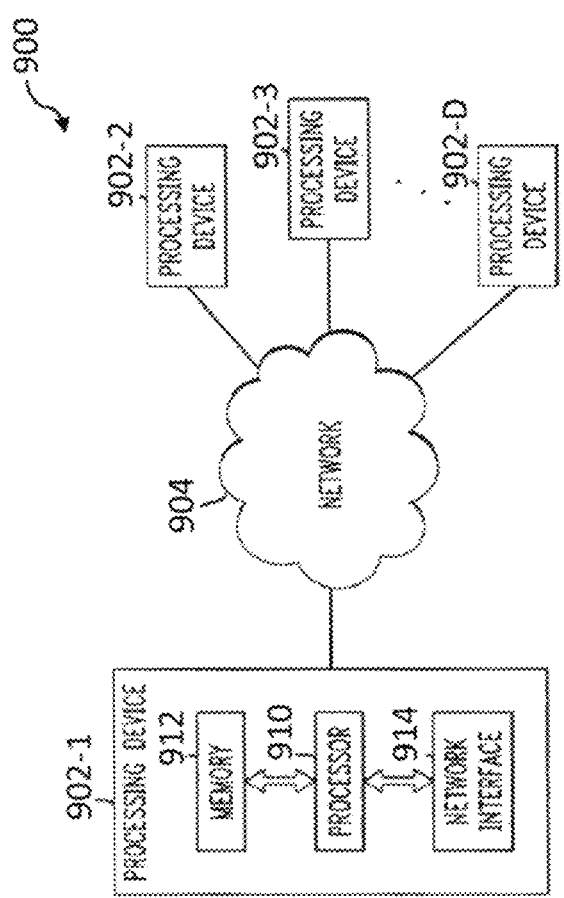

PAGE-LEVEL REFERENCE VOLTAGE PARAMETERIZATION FOR SOLID STATESOLID STATE STORAGE DEVICES

FIELD

The field relates generally to solid state storage media and, more particularly, to adjustments of read reference voltages for such solid state storage media.

BACKGROUND

Solid state storage devices can shift over time. For example, memory cell leakage (often referred to as charge leakage), memory cell damage and other disturbances to memory cells can alter the read voltage levels of the memory cells. Thus, the read reference voltages can shift over time. If the read voltage level of a memory cell shifts past a read reference voltage, a data error occurs, as the value of the data read from the memory cell is different than the value of the data that was written to the memory cell.

In many flash memory systems, for example, the read reference voltages vary as a function of page number, where different page numbers require different read reference voltage values in order to reduce the bit error rate. A need exists for techniques for determining read reference voltages for a given page.

SUMMARY

In one embodiment, a method comprises obtaining a bit error count for a plurality of page numbers across a plurality of blocks of a solid state storage device; determining a substantially optimal reference voltage for each page number that substantially minimizes a corresponding bit error count; collecting, for each reference voltage, page numbers and corresponding substantially optimal reference voltages; and determining, for each reference voltage, a non-linear function that substantially fits a distribution of the collected page numbers and corresponding substantially optimal reference voltages, wherein a given page having a given page number is read by employing a plurality of parameters of the non-linear function to generate the substantially optimal reference voltage for the given page number.

In some embodiments, the plurality of parameters of the non-linear function are stored in a memory for each page number. The non-linear function comprises, for example, a polynomial function, an exponential function and/or a logarithmic function, and the parameters of the non-linear function comprise the coefficients of the non-linear function.

In at least one embodiment, the given page having the given page number is read using the plurality of parameters of the non-linear function to generate the substantially optimal reference voltage for the given page number, and at least one additional page is read using a mean value for the substantially optimal reference voltage for the page number of the additional page.

Other illustrative embodiments include, without limitation, apparatus, systems, controllers, methods and computer program products comprising processor-readable storage media.

BRIEF DESCRIPTION OF THE DRAWINGS

FIGS. 8A and 8B illustrate exemplary reference voltage calculators that use the disclosed page-level reference voltage parameterization techniques, according to various embodiments of the disclosure; and FIG. 9 illustrates a processing platform that may be used to implement at least a portion of one or more embodiments of the disclosure.

DETAILED DESCRIPTION

Figure 1:
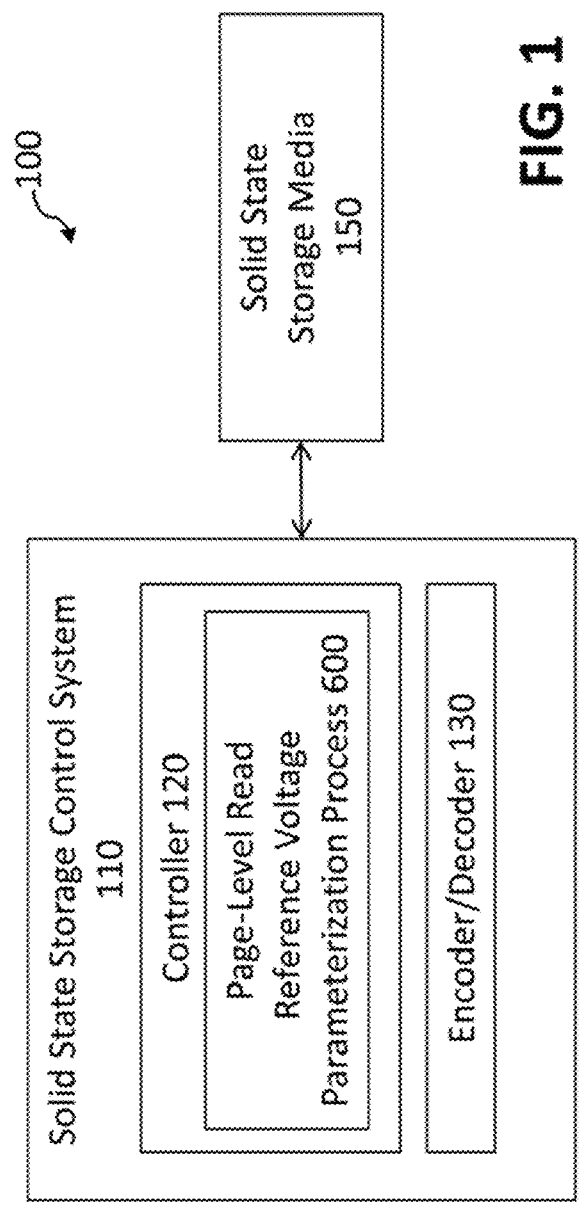
FIG. 1 is a schematic block diagram of an illustrative solid state storage system, in accordance with one or more embodiments of the present disclosure.

Illustrative embodiments will be described herein with reference to exemplary solid state storage devices and associated storage media, controllers, and other processing devices. It is to be appreciated, however, that these and other embodiments are not restricted to the particular illustrative system and device configurations shown. Accordingly, the term "solid state storage device" as used herein is intended to be broadly constnied, so as to encompass, for example, any storage device implementing the page-level reference voltage parameterization techniques described herein. Numerous other types of storage systems are also encompassed by the term "solid state storage device" as that term is broadly used herein.

As noted above, memory cell leakage and other disturbances in the memory cells may lead to data errors such that data read from the memory cells does not correspond to the originally stored data. The number of errors can be decreased by modifying the read reference voltages (also referred to as reference voltages) used to read data stored in the memory cells.

For example, in many solid state memory systems, reference voltages vary as a function of page number, where different page numbers require different reference voltage values in order to reduce the bit error rate. In one or more embodiments, techniques are provided to incorporate this variation during the first read of a page, where the page variation throughout the block is captured with a small number of parameters. As a result, the real-time performance of the solid state drive improves.

Various embodiments of the disclosure are directed to techniques for determining reference voltages for solid state memory devices using page-level reference voltage parameterization, such as single-level cell (SLC) or multi-level cell (MLC) (e.g., a triple-level cell (TLC) flash) NAND (Not And) memory devices. As used herein, a multi-level cell solid state memory comprises a memory where each memory cell stores two or more bits. While the disclosure is illustrated herein using memory cells that store an analog value as a voltage, the present disclosure can be employed with any storage mechanism for memory devices, such as the use of voltages or currents to represent stored data, as would be apparent to a person of ordinary skill in the art.

Embodiments of the disclosure determine read reference voltages for a memory using page-level reference voltage parameterization to address variations in the read reference voltages on a per-page basis as the solid state storage media evolves and/or degrades.

Considered individually, each non-volatile memory cell has a particular stored (programmed) charge that corresponds to a device reference voltage for that cell, and further corresponds to the logical bit values being stored in the cell. While, ideally, all of the cells in the non-volatile memory would have identical device reference voltages for the logical bit values stored, in practice, for a variety of reasons, the device reference voltages follow a probability distribution, e.g. a Gaussian distribution. Thus, considered in aggregate across a large number of cells, such as of a read unit, there are as many device reference voltage distributions (e.g., Gaussian probability curves) as there are states per cell (two states per bit of storage per cell). That is, for N-bits per cell of storage, there are $2^N$ states and the same number of device reference voltage distributions. Thus, $2^N-1$ different read reference voltages may be needed by read circuits in the non-volatile memory to distinguish between the $2^N$ states.

The device reference voltage distributions vary from their initial/nominal distributions by one or more factors, such as read disturb, write disturb, and retention loss. More particularly, over time, temperature, and other factors related to use, the location of each of the device reference voltage distributions can change with respect to the device reference voltage axis. Such changes increase the likelihood of read errors that are performed using a read reference voltage value for the read threshold that was previously established based on the nominal device reference voltage distribution.

The page-level reference voltage parameterization techniques disclosed herein can be applied to, for example, SLC solid state memories, where N=1, MLC solid state memories, where N=2, and TLC solid state memories, where N=3. Single-level cell memories store one bit per cell of storage, have two device reference voltage distributions (one for zeroes and another for ones), and use a single read threshold, read reference voltage $V_{REF0}$. From lower to higher device reference voltages, the two device reference voltage distributions are known as the E (Erased) state and D1 (first Data) state. While arbitrary, a mapping or coding in some embodiments assigns logical one to the E state and logical zero to the D1 state. Thus, references to zeroes and ones are proxy references for respective decodings of the D1 state and the E state. Multi-level cell memories store more than one bit per cell, have more than two device reference voltage distributions, and use multiple different read thresholds to distinguish the distributions. For example, a four level cell memory stores two bits per cell, has four device reference voltage distributions, and generally uses three read thresholds (read voltage references $V_{REF1}$, $V_{REF2}$, and $V_{REF3}$). From lower to higher device reference voltages, the four device reference voltage distributions are often referred to as the E (Erased), D1 (Data1), D2 (Data2), and D3 (Data3) states. While arbitrary, each of the four device reference voltage distributions is also mapped (addressed) in accordance with a particular binary sequence, such as a Gray code sequence. Thus, references to one or more of the 11, 10, 00, and 01 states, are proxy references for respective decodings of the E, D1, D2, and D3 states.

For a single-level memory cell, a tracking module estimates the means and variances of the voltage distributions of states D1 and E, and sets the read reference voltage based on these distributions. The calculated read reference voltage will lie at the intersection of the distributions when zeroes (state E) and ones (state D1) are equally likely in the written data. A read control module initiates data reads of the addressed page from the solid state device to the read buffer, with the first read at a read reference voltage of, for example, $V_{REF0}$ and the subsequent read reference voltages at different levels around $V_{REF0}$ as determined by channel tracking of the means and variances of the voltage distributions of states D1 and E, or by searching for $V_{REF}$ that substantially minimizes the bit errors of the read operation. For a multi-level memory cell, the tracking module typically estimates the means and variances of the voltage distributions of all states.

The memory cells of a memory device can be grouped into data units referred to herein as data pages or blocks. A data page can correspond, for example, to a group of memory cells that are read together during a read operation. A group of memory pages that are erased at substantially the same time may be referred to as a block or erasure unit. Memory cells are programmed in units of pages and, after programming, the pages are not re-programmed until after the block of pages is erased. Garbage collection operations can be performed on the blocks of pages, wherein the blocks are erased after active data stored in each block is moved to another location. Thus, as a result of garbage collection, each memory cell of the memory device undergoes numerous program/erase (PE) cycles during the lifetime of the memory cell. In floating gate transistor memory cells, for example, each PE cycle can degrade the cell, and after many PE cycles, lead to a decreased ability of the cell to retain data without substantial charge leakage.

FIG. 1 is a schematic block diagram of an illustrative solid state storage system 100. As shown in FIG. 1, the illustrative solid state memory system 100 comprises a solid state storage control system 110 and a solid state storage media 150. The exemplary solid state storage control system 110 comprises a controller 120 and an encoder/decoder block 130. In an alternative embodiment, the encoder/decoder block 130 may be implemented inside the controller 120.

As shown in FIG. 1, the controller 120 comprises a page-level read reference voltage parameterization process 600, discussed below in conjunction with FIGS. 6A and 6B, to implement the page-level reference voltage parameterization techniques described herein. The encoder/decoder block 130 may be implemented, for example, using well-known commercially available techniques and/or products. The encoder within the encoder/decoder block 130 may implement, for example, error correction encoding, such as a low-density parity-check (LDPC) encoding. The decoder within the encoder/decoder block 130 may be embodied, for example, as a hard decision decoder, such as a hard decision low-density parity-check (HLDPC) decoder.

The solid state storage media 150 comprises a memory array, such as a single-level or multi-level cell flash memory, a NAND flash memory, a phase-change memory (PCM), a magneto-resistive random access memory (MRAM), a nano RAM (NRAM), a NOR (Not OR) flash memory, a dynamic RAM (DRAM) or another non-volatile memory (NVM).

While the disclosure is illustrated primarily in the context of a solid state storage device (SSD), the disclosed page-level reference voltage parameterization techniques can be applied in solid state hybrid drives (SSHD) and other storage devices, as would be apparent to a person of ordinary skill in the art based on the present disclosure.

Figure 2:
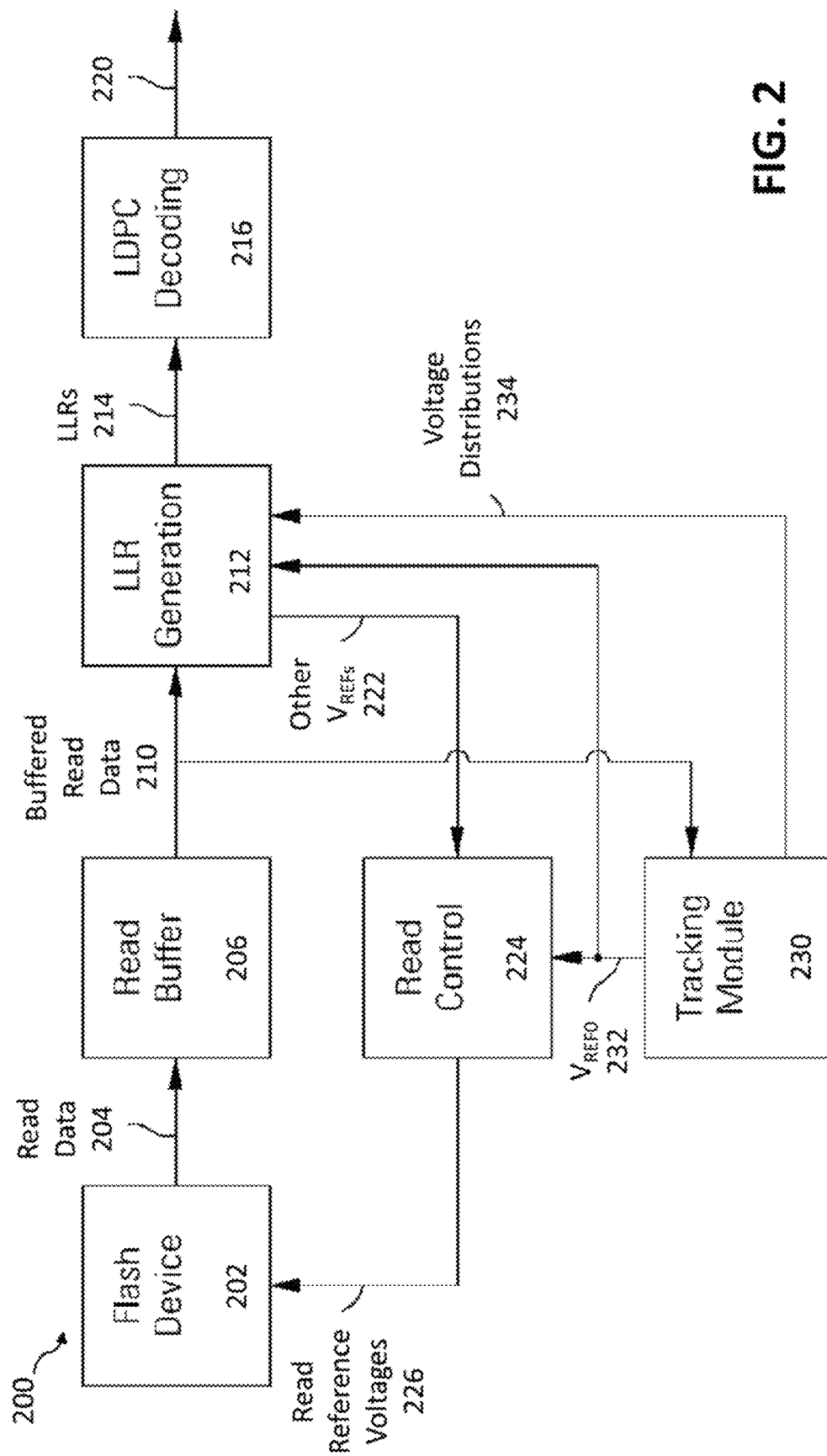
FIG. 2 illustrates a flash channel read path with read reference voltage tracking, in accordance with some embodiments of the present disclosure.

FIG. 2 illustrates a flash channel read path 200 with channel tracking-based read retry voltage adjustment in accordance with some embodiments of the present disclosure. The read path 200 includes a flash device 202 having an array of memory cells, or another type of non-volatile memory. Based upon the disclosure provided herein, one of ordinary skill in the art will recognize a variety of storage technologies that can benefit from the page-level reference voltage parameterization techniques disclosed herein.

Read reference voltages 226 are applied to the flash device 202 by a read control device 224 in a series of N reads. Each memory cell is read N times, and the N reads result in read data 204 containing N bits per memory cell as a quantized version of the stored voltage on the memory cell. The read data 204 is buffered in a read buffer 206, and buffered read data 210 from read buffer 206 is provided to a log likelihood ratio (LLR) generation circuit 212 (or likelihood generator, which can also be adapted to use plain likelihood values). The N bits for a memory cell are mapped to log likelihood ratios 214 for the memory cell in log likelihood ratio generation circuit 212. In some embodiments, the log likelihood ratio generation circuit 212 contains a lookup table that maps the read patterns in buffered read data 210 to log likelihood ratios 214.

A tracking module 230 receives the buffered read data 210 from the read buffer 206, or from any other suitable source. Generally, channel tracking techniques adapt to the changes in read reference voltages to maintain a desired performance level. Adaptive tracking algorithms typically track variations in the solid state storage channel and consequently, help to maintain a set of updated channel parameters. The updated channel parameters are used, for example, to adjust read reference voltages. United States Published Patent Application No. 2013/0343131, filed Jun. 26, 2012, entitled "Fast Tracking for Flash Channels," and/or United States Published Patent Application No. 2015/0287453, entitled "Optimization of Read Thresholds for Non-Volatile Memory," (now U.S. Pat. No. 9,595,320) incorporated by reference herein in their entirety, disclose techniques for adapting read reference voltages.

The tracking module 230 identifies the intersection point between neighboring voltage distributions for a memory cell, in a known manner, and provides read reference voltage level $V_{REF0}$ 232, including the read reference voltage $V_{REF0}$ corresponding to the intersection. When the read reference voltage $V_{REF0}$ corresponding to the intersection is used for the soft read operation, it will result in a reduction in the bit error rate. The read reference voltage $V_{REF0}$ is used in some embodiments as the first read reference voltage of a read retry operation, and additional read reference voltages around $V_{REF0}$ to obtain substantially all possible log likelihood ratio values. The tracking module 230 thus generates the read reference voltage level $V_{REF0}$ 232 to be used in read retry operations. In other embodiments, $V_{REF0}$ may not correspond to the intersection of the distributions depending on the tracking algorithm design, tracking inaccuracy, or the actual channel distributions deviating from Gaussian behavior in either the peak or the tail. In other situations, $V_{REF0}$ may coincide with the intersection of the distributions but may not be applied first and that would be accounted for in the calculations in 212 and 224.

The tracking module 230 also tracks the voltage distributions 234. In some embodiments, the tracking module 230 calculates the voltage distribution means and variances for each voltage distribution 234 corresponding to each possible state in each memory cell. The voltage distributions 234 can be calculated in any suitable manner based on the read data. As an example, the tracking module 230 can operate as disclosed in U.S. Published Patent Application No. 2013/0343131, filed Jun. 26, 2012, entitled "Fast Tracking for Flash Channels," incorporated by reference herein in its entirety. In some embodiments, the tracking module 230 tracks intersections without estimating means or variances.

For a two-state memory cell, or single-level memory cell, the tracking module 230 estimates the means and variances of the voltage distributions of states "1" and "0", as well as the read reference voltage $V_{REF0}$ that most reduces the bit error rate and which likely lies at the intersection of those distributions, in a known manner.

The tracking module 230 provides the voltage distributions 234 to the log likelihood ratio generation circuit 212 for use in updating the log likelihood ratio lookup table. The log likelihood ratio generation circuit 212 is used to calculate likelihood values 214 for decoding by an LDPC (low-density parity-check) decoder 216 that generates decoded data 220. The log likelihood ratio generation circuit 212 also determines where to place the other N−1 read reference voltages around $V_{REF0}$ 232 based on the voltage distributions 234 and on the read reference voltage $V_{REF0}$ 232 to obtain substantially all possible log likelihood ratio values when the read patterns in buffered read data 210 are mapped to log likelihood ratios. The log likelihood ratio generation circuit 212 determines where to place the other N−1 read reference voltages around $V_{REF0}$ 232, updates the lookup table, and provides the N−1 read reference voltage levels 222 to a read controller 224. It is important to note that the division of functionality is not limited to the example embodiments disclosed herein. For example, in other embodiments, the tracking module 230 calculates and provides read reference voltages around $V_{REF0}$ 232 and provides those voltages to the log likelihood ratio generation circuit 212, rather than the log likelihood ratio generation circuit 212 determining where to place the other N−1 read reference voltages around $V_{REF0}$ 232, and these divisions of functionality are to be seen as equivalent.

The read reference voltages are stored in log likelihood ratio generation circuit 212 in some embodiments, as calculated based on the log likelihood ratio lookup table in log likelihood ratio generation circuit 212 and on the voltage distribution means and variances 234 from tracking module 230.

The read controller 224 controls read retry operations in the flash device 202, providing each of the N read reference voltages (including $V_{REF0}$ 232) to be used when reading the memory cells in the flash device 202. The read controller 224 initiates N reads of a page, with the first read using read reference voltage $V_{REF0}$ in some embodiments, and with the subsequent N−1 reads at read reference voltages around $V_{REF0}$ as determined by log likelihood ratio generation circuit 212.

Figure 3:
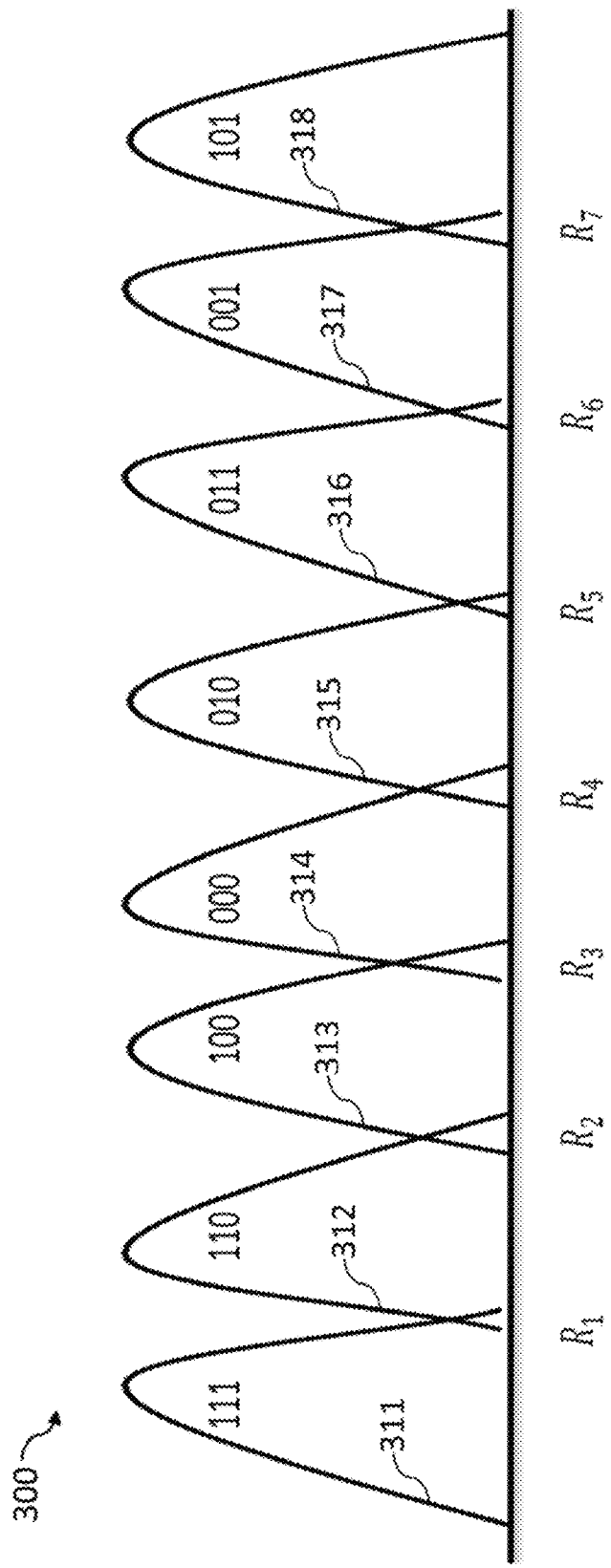
FIG. 3 is a graph of cell voltage distributions for a normal hard decision read operation in a solid state memory device, in accordance with some embodiments of the present disclosure.

FIG. 3 is a graph 300 of cell voltage distributions 311 through 318 for a normal hard decision read operation in a TLC flash memory device, in accordance with some embodiments of the present disclosure. The exemplary TLC flash memory device is a BiCS3 NAND flash memory from Toshiba Memory America, Inc. The resulting voltages read from the memory cell thus appear something like the distributions 311-318 shown in the graph 300 of FIG. 3, rather than eight distinct discrete voltage levels corresponding to the eight states 111, 110, 100, 000, 010, 011, 001, 101 at the corresponding target state voltage levels. Each distribution 311-318 will have a mean roughly equal to the target voltage for the respective state, and the variance will depend upon the noise. Because the voltages on the memory cell are not accurate, the voltages read back can vary according to the distributions 311-318. In some embodiments, during the initial read of the memory cell, reference voltages $R_i$ (i=1, 2, ..., 7) (e.g., $R_1$ through $R_7$) are used during a read to determine the state of the memory cell, returning hard decisions about the state of the memory cell.

For example, in general, if the read voltage is below reference voltage $R_1$, a decision indicates that the memory cell is determined to be in state 111. If the read voltage is above reference voltage $R_1$ and below reference voltage $R_2$, a decision indicates that the memory cell is determined to be in state 110, and so on.

The first, second, and third bits in a given state are often referred to as the most-significant bits, center-significant bits, and least-significant bits (MSB, CSB, LSB), respectively. In some embodiments, the read operation is divided into a process of reading least significant bit (LSB) pages, center significant bit (CSB) pages and most significant bit (MSB) pages. States 111, 011, 001 and 101, for example, correspond to a least significant bit value of 1, and states 110, 100, 000 and 101 correspond to a least significant bit value of 0. When reading the least significant bit, for example, the reference voltages $R_1$ and $R_5$ are applied to the memory cell to obtain the least significant bit.

While FIG. 3 illustrates the cell voltage distributions for a TLC flash memory, the disclosed page-level reference voltage parameterization techniques can be applied to SLC, MLC, QLC, etc. and other flash memory systems, as would be apparent to a person of ordinary skill in the art.

For each $R_i$ shown in FIG. 3, a pair ($V_{oi}$, $P_i$) can be derived for each page number, where $V_{oi}$ is the substantially optimal reference voltage that substantially minimizes the bit error rate, and $P_i$ is the corresponding page number.

Page-Level Reference Voltage Parameterization

The substantially optimal value of each individual reference voltage level can be computed for each page number using offline training data or real-time recovered data.

In some embodiments, there are three exemplary methods to obtain the sampled substantially optimal reference voltages ($V_{oi}$) for each page number:

1. Scan all the pages with the same page number $P_i$ across multiple blocks with all possible reference voltage values. The bit error count of each read page k with reference voltage value v (it can be a scaler or vector depending on page type) can be denoted as $r_k(v)$. Then, the substantially optimal reference voltages is calculated by the following equation:

$$V_{oi} = \operatorname*{argmin}_{v} \sum_{k} r_k(v).$$

The sample pair is then ($V_{oi}$, $P_i$).

2. A unit can be defined as one or multiple codewords with the same page number across one or multiple blocks. The codewords can come from same or different pages (of the same page number) and/or blocks. Each unit corresponds to a same page number $P_i$. Each unit is scanned individually for the substantially optimal $R_i$ that minimizes the bit error in that unit. Assuming that there are in total K units in the testing set, all the unit-level optimal reference voltages are averaged to obtain $V_{oi}$, as follows:

$$V_{oi} = \frac{1}{K} \sum_{k=1,...,K} \operatorname*{argmin}_{v} r_k(v).$$

The sample pair is then ($V_{oi}$, $P_i$).

3. When searching for the optimal reference voltage, only the noisy units may be of interest (since they would typically be the bottleneck for NAND performance), for example, identified using a predefined noise criteria or threshold. An error threshold, for example, can be chosen such that if the number of bit errors in the searching unit exceeds the specified threshold, the units are selected for parameterization, and such units are called outliers. Therefore, this is a two-step process:

a. Select Outliers: use Methods 1 or 2 to find a universal set of reference voltages for each page number; find the units (same definition as in Method 2) with the bit errors exceeding the pre-determined threshold under such universal set of reference voltages. These units are outliers.

b. Calculate Substantially Optimal Reference Voltages for Outliers: Apply Method 1 or 2 to the outliers.

Figure 4:
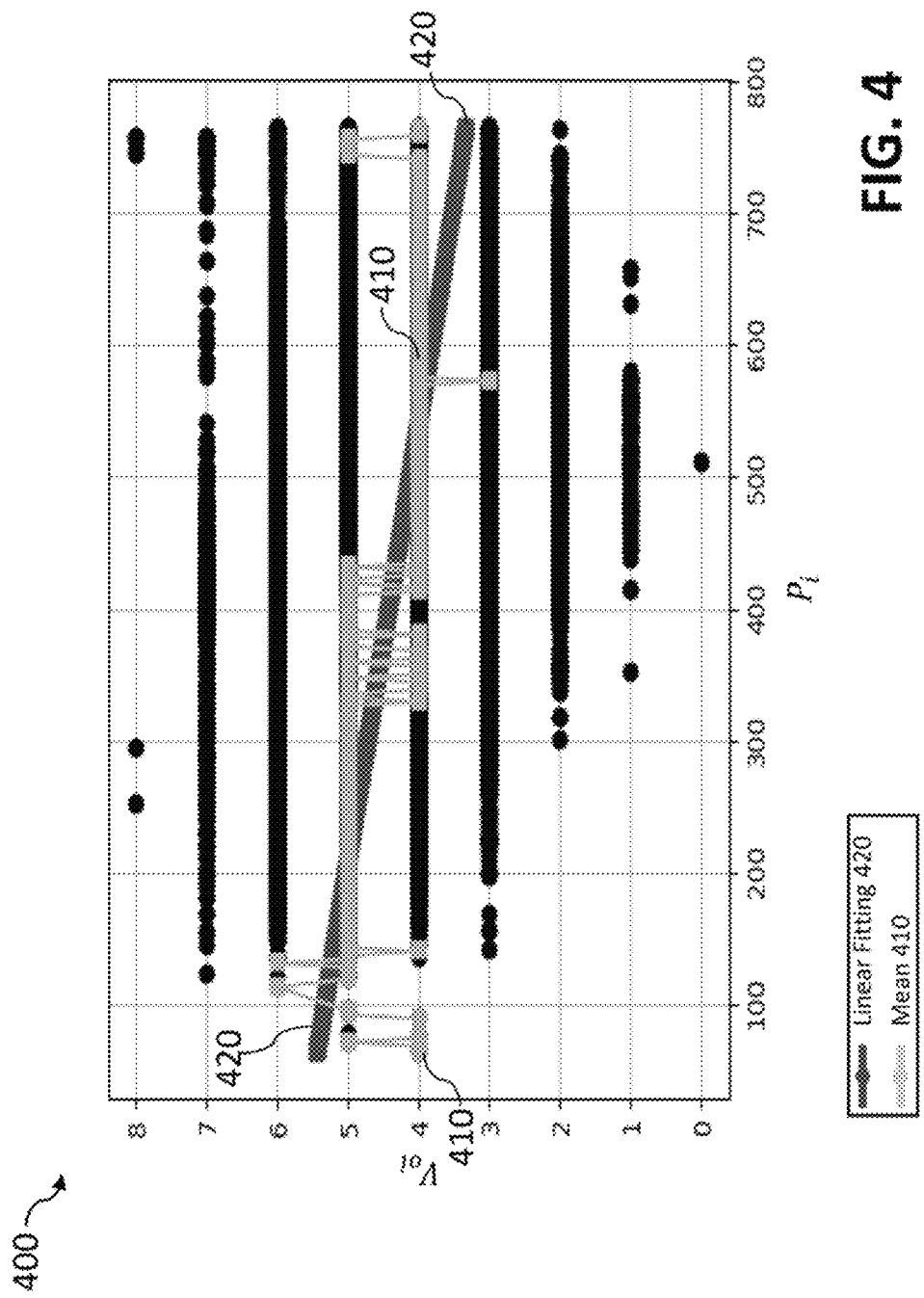
FIG. 4 illustrates a plot of page number versus reference voltage, collected over a number of pages for each reference voltage, with a linear parameterization of page-level reference voltages, in at least one embodiment.

FIG. 4 illustrates a scatter plot 400 of page number versus reference voltage (e.g., ($V_{oi}$, $P_i$) pairs) collected over a number of pages for each reference voltage $R_i$, to illustrate the correlation between the substantially optimal reference voltage and page number, in one or more embodiments.

In FIG. 4, the page variation can be tracked in various ways. For example, a mean voltage value 410 is calculated for each page number (e.g., perform multiple read operation for a given page number and use the mean reading across the die for the given page number). These values are calibrated for individual pages and optionally additional various conditions (e.g., in terms of retention, program/erase (PIE) cycle, program temperature, and read temperature). Before reading a page, the corresponding mean voltage for the page number would be obtained and applied.

One or more aspects of the disclosure recognize that page-to-page variation can also be tracked using parametrization, or "curve fitting" methods. Depending on the specific NAND flash characteristics, a function can be constructed from the reference voltage values/page number distribution. In the example of FIG. 4, a linear curve 420 (i.e. a regression) fits the distribution of reference voltage values/page number pairs. For each voltage level $R_i$ (i=1, 2, ..., 7), the linear fitting 420 is represented by the following equation:

$$V_i(P) = a_i * P + b_i,$$

where voltage value $V_i$ is a function of page number P, uniquely determined by two coefficients $a_i$ and $b_i$. Therefore, for an exemplary TLC flash memory, a total of 14 coefficients (two coefficients for each of the seven reference voltages $R_i$) are required to track the page-to-page variation for each die. This is a considerable reduction in memory space when compared to, for example, a block with 768 pages, where each page requires multiple reference voltages.

One or more aspects of the disclosure further recognize that, for some solid state memories, a different type of parameter fit, other than the linear fit of FIG. 4, collectively referred to herein as a non-linear fit (for example, a parabolic curve, at least a second order polynomial fitting, an exponential fitting, or a logarithmic fitting) is needed. In the case of the following fourth order polynomial fitting, for example:

$$V_i(P)=a_i*P^4+b_i*P^3+c_i*P^2+d_i*P+e_i,$$

a total of 35 coefficients (five coefficients for each of the seven reference voltages $R_i$) are required for an exemplary TLC flash memory to track the page-to-page variation for each die.

Figure 5:
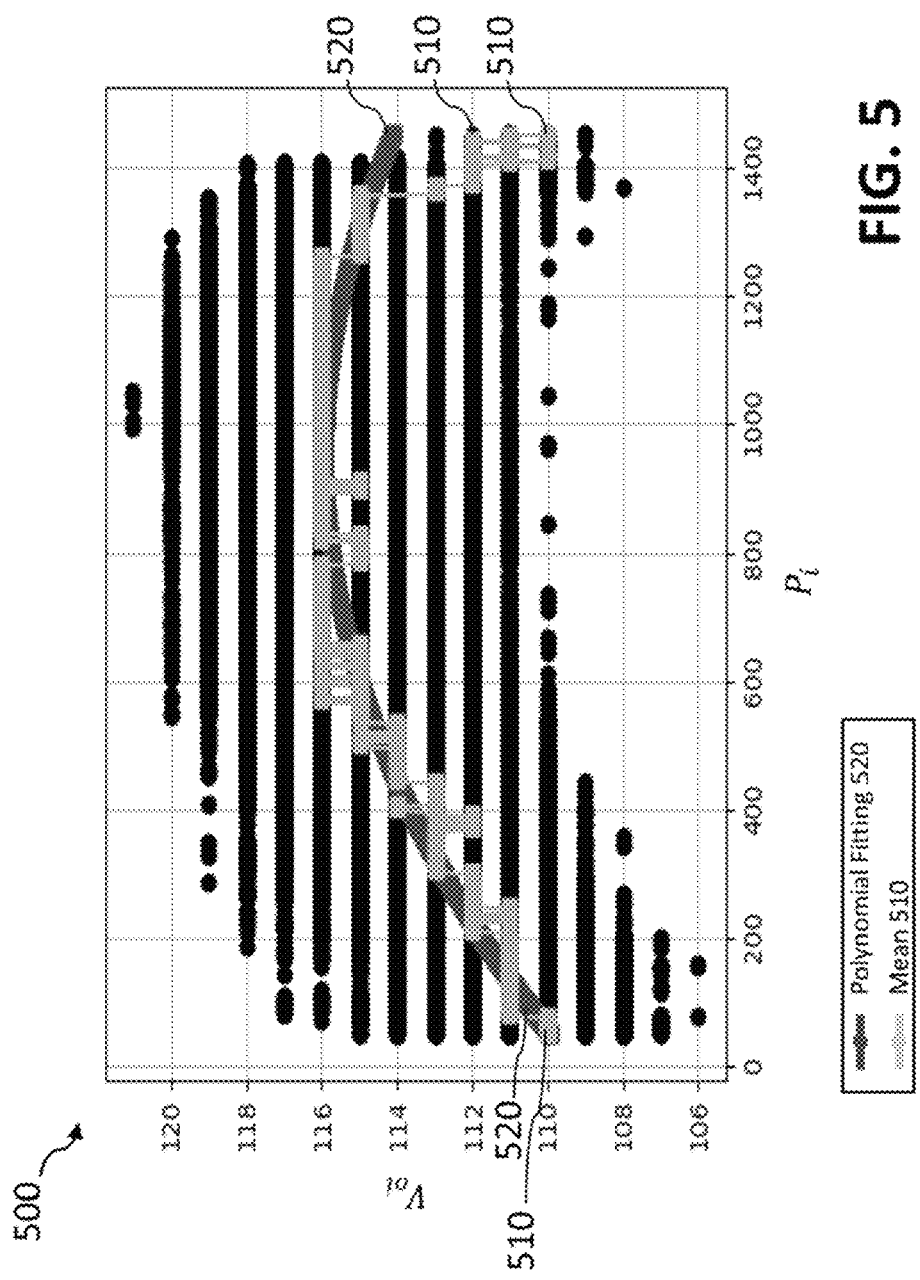
FIG. 5 illustrates a plot of page number versus reference voltage, collected over a number of pages for each reference voltage, with a non-linear parameterization of page-level reference voltages, in one or more embodiments.

FIG. 5 illustrates a scatter plot 500 of page number versus reference voltage (e.g., ($V_{oi}$, $P_i$) pairs) collected over a number of pages for each reference voltage $R_i$, to illustrate the correlation between the substantially optimal reference voltage and page number, in one or more embodiments. A mean voltage value 510 is calculated for each page number, in a similar manner as FIG. 4.

Thus, in some circumstances, a non-linear function 520 that substantially fits the distribution of mean voltage values 510 of the collected page numbers and corresponding substantially optimal reference voltages is used to parameterize the page-level reference voltages. In the example of FIG. 5, the non-linear function 520 corresponds to a second-order polynomial.

It has been found, for example, that a fourth order polynomial fitting provides an improved page-level reference voltage parameterization relative to the linear fitting discussed above in conjunction with FIG. 4, for certain solid state memories, such as the Micron B0KB NAND flash memory devices from Micron Technology, Inc.

Hybrid Mode

One or more embodiments of the disclosure recognize that the disclosed page-level reference voltage parameterization techniques of FIGS. 4 and 5 (e.g., curve fitting) may not sufficiently track the reference voltage variation in certain pages. For example, on boundary pages for a physical layout (e.g., closer to the edge of the device or other block locations on the die). In such situations, a combination of mean values and curve fitting scheme can be applied. In other words, some pages can be parameterized using the disclosed page-level reference voltage parameterization techniques, while other pages can use dedicated or default values. For example, a given page having a given page number can be read using the coefficients of the non-linear function 520 of FIG. 5 to generate the substantially optimal reference voltage for the given page number. In addition, at least one additional page (e.g., a boundary page or another page that does not exhibit improved performance using the disclosed page-level reference voltage parameterization techniques) can be read using a mean value as the substantially optimal reference voltage for the page number of the at least one additional page.

Computation of Coefficients in Drive

There are various options for computing the coefficients for curve fitting, either offline or in real-time or using a combination of both. The following is an example on how the initial values are computed offline and then an incremental update on-the-fly is applied in a solid state drive. With offline calibration of a linear fit for example, the coefficients of a linear regression model can be calculated using linear least squares methods, and stored in memory (e.g., a dynamic random access memory (DRAM)). Different NAND conditions (in terms of retention, P/E cycle, program/read temperature, etc.) can optionally use different sets of coefficients, as discussed further below in conjunction with FIGS. 8A and 8B. Given the initial values, the coefficients can be computed and updated on the fly using previously recovered data.

Figure 6A:
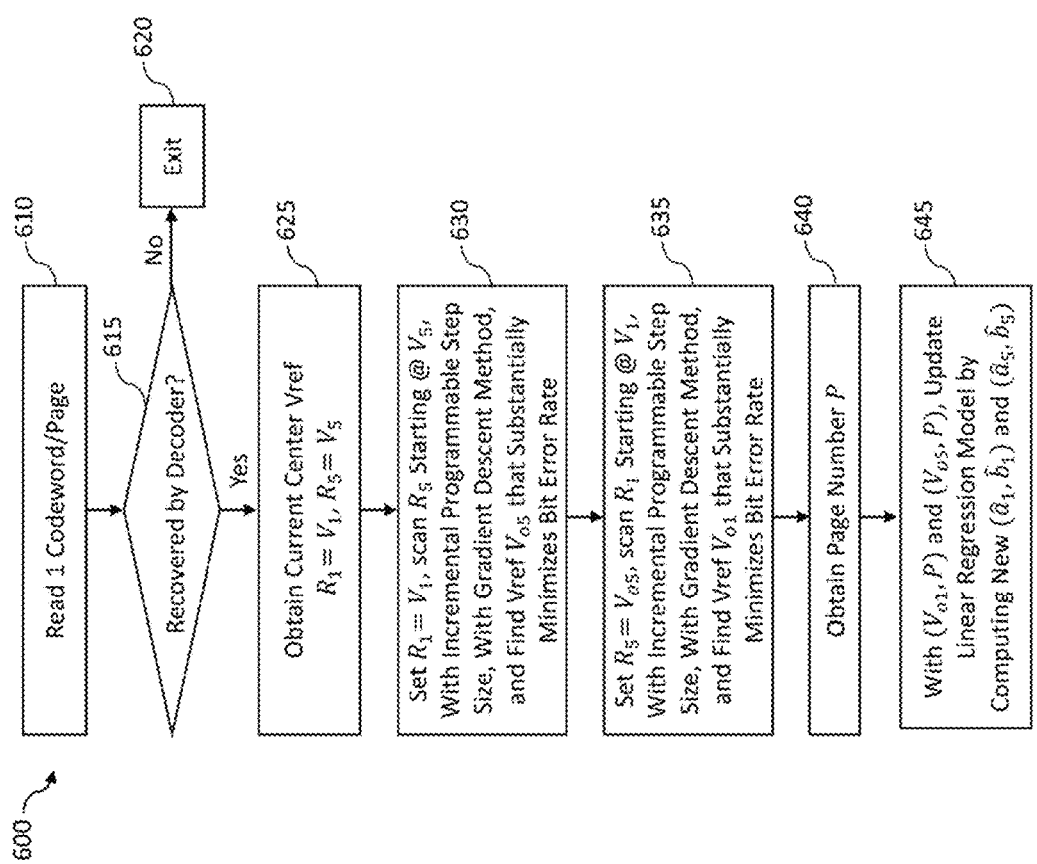
FIGS. 6A and 6B are flow charts illustrating exemplary implementations of coefficients calibration processes that use recovered data to determine the coefficients of the linear function of FIG. 4 and a representative non-linear function of FIG. 5, respectively, according to embodiments of the disclosure.

FIG. 6A is a flow chart illustrating an exemplary implementation of a linear function coefficients calibration process 600 that uses recovered data to determine the coefficients of the linear function 420 of FIG. 4, according to one embodiment of the disclosure. Generally, the exemplary linear function coefficients calibration process 600 provides an example of collecting data in a solid state drive using a representative LSB page of the exemplary BiCS3 NAND flash memory from Toshiba Memory America, Inc., for an incremental real-time update of the regression model (e.g., the linear function 420).

As shown in FIG. 6A, the exemplary linear function coefficients calibration process 600 initially reads one codeword or page during (also referred to herein as one unit) step 610. For each die and each NAND condition, the coefficients of the linear function 420 of FIG. 4 can be calibrated at either a codeword level or a page level. Each page typically comprises multiple codewords. The optimal voltage $V_{oi}$ (in FIGS. 4 and 5) can be defined as the voltage that substantially minimizes the bit error rate of a codeword or a page. In either case, the coefficients can be computed in the manner shown in FIG. 6A.

During step 615, a test is performed to determine if the codeword is recovered by the decoder 130 (FIG. 1), such as an LDPC decoder. If it is determined during step 615 that the codeword is not recovered by the decoder 130, then the program exits during step 620.

If, however, it is determined during step 615 that the codeword is recovered by the decoder 130, then the linear function coefficients calibration process 600 obtains the current center reference voltage (Vref) during step 625, as follows:

$$R_1=V_1, R_5=V_5.$$

During step 630, $R_1$ is set to $V_1$ and the linear function coefficients calibration process 600 scans $R_5$, starting at $V_5$, with an incremental programmable step size (e.g., a value of two), using a gradient descent method, as discussed further below in conjunction with FIG. 7. The value of the reference voltage $Vo_5$ is found that substantially minimizes the bit error rate.

Thereafter, the exemplary linear function coefficients calibration process 600 sets $R_5$ to $V_{o5}$ and the linear function coefficients calibration process 600 scans $R_1$, starting at $V_1$, with an incremental programmable step size (e.g., a value of two), using a gradient descent method during step 635. The value of the reference voltage $V_{o1}$ is found that substantially minimizes the bit error rate.

The page number P is obtained during step 640. The linear regression model is updated during step 645 with ($V_{o1}$, P) and ($V_{o5}$, P), by computing new values for ($\hat{a}_1$, $\hat{b}_1$) and ($\hat{a}_5$, $\hat{b}_5$) of the linear function 420 of FIG. 4.

While the exemplary linear function coefficients calibration process 600 determines the coefficients for the linear function 420 of FIG. 4, the linear function coefficients calibration process 600 can be modified to determine the coefficients for the non-linear function 520 of FIG. 5, as would be apparent to a person of ordinary skill in the art.

Thus, as shown in FIG. 6A and as discussed above, the exemplary linear function coefficients calibration process 600 first reads a codeword or a page that can be (or already is) recovered by the decoder 130. Consider the LSB page of the exemplary BiCS3 flash device as an example, where the relevant reference voltage levels are $R_1$ and $R_5$. The linear function coefficients calibration process 600 then searches for the optimal voltage $V_{o1}$ and $V_{o5}$, individually, during steps 630 and 635. When searching for $V_{o5}$, $R_1$ is set at the current voltage value $V_1$. $R_5$ is scanned starting at current voltage value $V_5$, with a certain incremental step. Ideally, the step shall be set to 1. However, as a compromise for efficiency, the step size can be set to a larger number, such as two.

A gradient descent method can optionally be applied during steps 630 and 635 to accelerate the searching process, as discussed further below in conjunction with FIG. 7. Note that, with a step size larger than 1 and a gradient descent method, the linear function coefficients calibration process 600 may not provide the global optimal reference voltage. However, this is a compromise between efficiency and effectiveness to obtain a substantially optimal reference voltage.

After $V_{o5}$ is obtained during step 630, $R_5$ is set to $V_{o5}$, and the search for $V_{o1}$ starts during step 635 in a similar manner. Paired with the corresponding page number P, ($V_{o1}$, P) and ($V_{o5}$, P) are used to update the linear regression model and to compute new coefficients. Statistical gradient descent (SGD) techniques can be used for a linear model update, which yields the following coefficients, for i=1, 2, . . . , 7:

$$\hat{a}_i = a_i + 2\eta(V_{oi} - (a_i * P + b_i)) * P; \text{ and}$$

$$\hat{b}_i + 2\eta(V_{oi} - (a_i * P + b_i)),$$

where $(\hat{a}_i, \hat{b}_i)$ are calculated from the previous values $(a_i, b_i)$ and the new data pair ($V_{oi}$, P), given a constant step size $\eta$. This algorithm can be extended to other pages and/or NAND types, as would be apparent to a person of ordinary skill in the art.

Thus, as shown in FIG. 6A and as discussed above, the exemplary linear function coefficients calibration process 600 first reads a codeword or a page that can be (or already is) recovered by the decoder 130. Consider the LSB page of the exemplary BiCS3 flash device as an example, where the relevant reference voltage levels are $R_1$ and $R_5$. The linear function coefficients calibration process 600 then searches for the optimal voltage $V_{o1}$ and $V_{o5}$, individually, during steps 630 and 635. When searching for $V_{o5}$, $R_1$ is set at the current voltage value $V_1$. $R_5$ is scanned starting at current voltage value $V_5$, with a certain incremental step. Ideally, the step shall be set to 1. However, as a compromise for efficiency, the step size can be set to a larger number, such as two.

A gradient descent method can optionally be applied during steps 630 and 635 to accelerate the searching process, as discussed further below in conjunction with FIG. 7. Note that, with a step size larger than 1 and a gradient descent method, the linear function coefficients calibration process 600 may not provide the global optimal reference voltage. However, this is a compromise between efficiency and effectiveness to obtain a substantially optimal reference voltage.

After $V_{o5}$ is obtained during step 630, $R_5$ is set to $V_{o5}$, and the search for $V_{o1}$ starts during step 635 in a similar manner. Paired with the corresponding page number P, ($V_{o1}$, P) and ($V_{o5}$, P) are used to update the linear regression model and to compute new coefficients. Statistical gradient descent (SGD) techniques can be used for a linear model update, which yields the following coefficients, for i=1, 2, . . . , 7:

$$\hat{a}_i = a_i + 2\eta(V_{oi} - (a_i * P + b_i)) * P; \text{ and}$$

$$\hat{b}_i = b_i + 2\eta(V_{oi} - (a_i * P + b_i)),$$

where $(\hat{a}_i, \hat{b}_i)$ are calculated from the previous values $(a_i, b_i)$ and the new data pair ($V_{oi}$, P), given a constant step size $\eta$. This algorithm can be extended to other pages and/or NAND types, as would be apparent to a person of ordinary skill in the art.

Figure 6B:
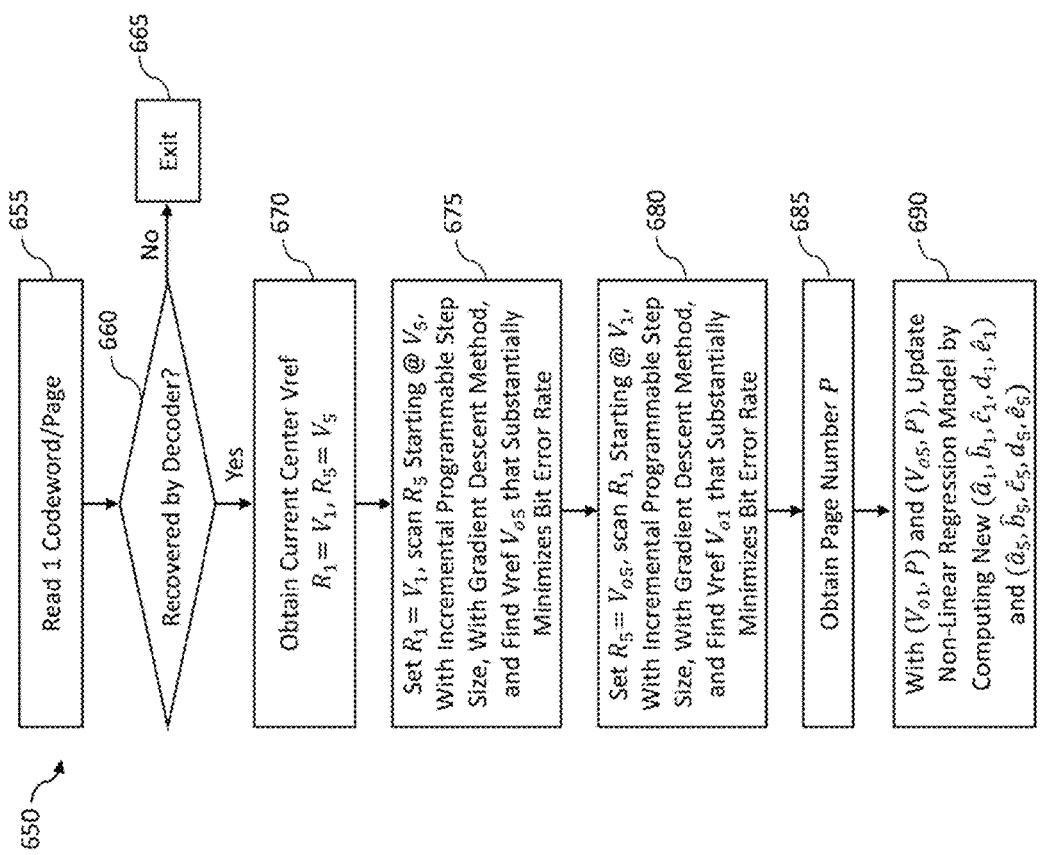

FIG. 6B is a flow chart illustrating an exemplary implementation of a non-linear function coefficients calibration process 650 that uses recovered data to determine the coefficients of the non-linear function 520 of FIG. 5, according to one embodiment of the disclosure. Generally, the exemplary non-linear function coefficients calibration process 650 provides an example of collecting data in a solid state drive using a representative LSB page of the exemplary the Micron B0KB NAND flash memory devices from Micron Technology, Inc., for an incremental real-time update of the regression model (e.g., the non-linear function 520).

As shown in FIG. 6B, the exemplary non-linear function coefficients calibration process 650 initially reads one codeword or page (also referred to herein as one unit) during step 655. For each die and each NAND condition, the coefficients of the non-linear function 520 of FIG. 5 can be calibrated at either a codeword level or a page level. Each page typically comprises multiple codewords. The optimal voltage $V_{oi}$ (in FIGS. 4 and 5) can be defined as the voltage that substantially minimizes the bit error rate of a codeword or a page. In either case, the coefficients can be computed in the manner shown in FIG. 6B.

During step 660, a test is performed to determine if the codeword is recovered by the decoder 130 (FIG. 1), such as an LDPC decoder. If it is determined during step 660 that the codeword is not recovered by the decoder 130, then the program exits during step 665.

If, however, it is determined during step 660 that the codeword is recovered by the decoder 130, then the non-linear function coefficients calibration process 650 obtains the current center reference voltage (Vref) during step 670, as follows:

$$R_1 = V_1, R_5 = V_5.$$

During step 675, $R_1$ is set to $V_1$ and the non-linear function coefficients calibration process 650 scans $R_5$, starting at $V_5$, with an incremental programmable step size (e.g., a value of two), using a gradient descent method, as discussed further below in conjunction with FIG. 7. The value of the reference voltage $Vo_5$ is found that substantially minimizes the bit error rate.

Thereafter, the exemplary non-linear function coefficients calibration process 650 sets $R_5$ to $V_{o5}$ and the non-linear function coefficients calibration process 650 scans $R_1$, starting at $V_1$, with an incremental programmable step size (e.g., a value of two), using a gradient descent method during step 680. The value of the reference voltage $V_{o1}$ is found that substantially minimizes the bit error rate.

The page number P is obtained during step 685. The linear regression model is updated during step 690 with ($V_{o1}$, P) and ($V_{o5}$, P), by computing new values for $(\hat{a}_1, \hat{b}_1, \hat{c}_1, \hat{d}_1, \hat{e}_1)$ and $(\hat{a}_5, \hat{b}_5, \hat{c}_5, \hat{d}_5, \hat{e}_5)$ of the non-linear function 520 of FIG. 5.

Statistical gradient descent (SGD) techniques can be used for a non-linear model update for an exemplary fourth order polynomial, which yields the following coefficients, for i=1, 2, . . . , 7:

$$\hat{a}_i = a_i + 2\eta(V_{oi} - (a_i * P^4 + b_i P^3 + c_i P^2 + d_i P + e_i)) * P^4$$

$$\hat{b}_i = b_i + 2\eta(V_{oi} - (a_i * P^4 + b_i P^3 + c_i P^2 + d_i P + e_i)) * P^3$$

$$\hat{c}_i = c_i + 2\eta(V_{oi} - (a_i * P^4 + b_i P^3 + c_i P^2 + d_i P + e_i)) * P^2$$

$$\hat{d}_i = d_i + 2\eta(V_{oi} - (a_i*P^4 + b_i*P^3 + c_i*P^2 + d_i*P + e_i))*P$$

$$\hat{e}_i = e_i + 2\eta(V_{oi} - (a_i*P^4 + b_i*P^3 + c_i*P^2 + d_i*P + e_i))$$

where new values for ($\hat{a}_1$, $\hat{b}_1$, $\hat{c}_1$, $d_1$, $\hat{e}_1$) are calculated from the previous values $a_i$, $b_i$, $c_i$, $d_i$, and $e_i$ and the new data pair ($V_{oi}$, P), given a constant step size $\eta$.

Figure 7:
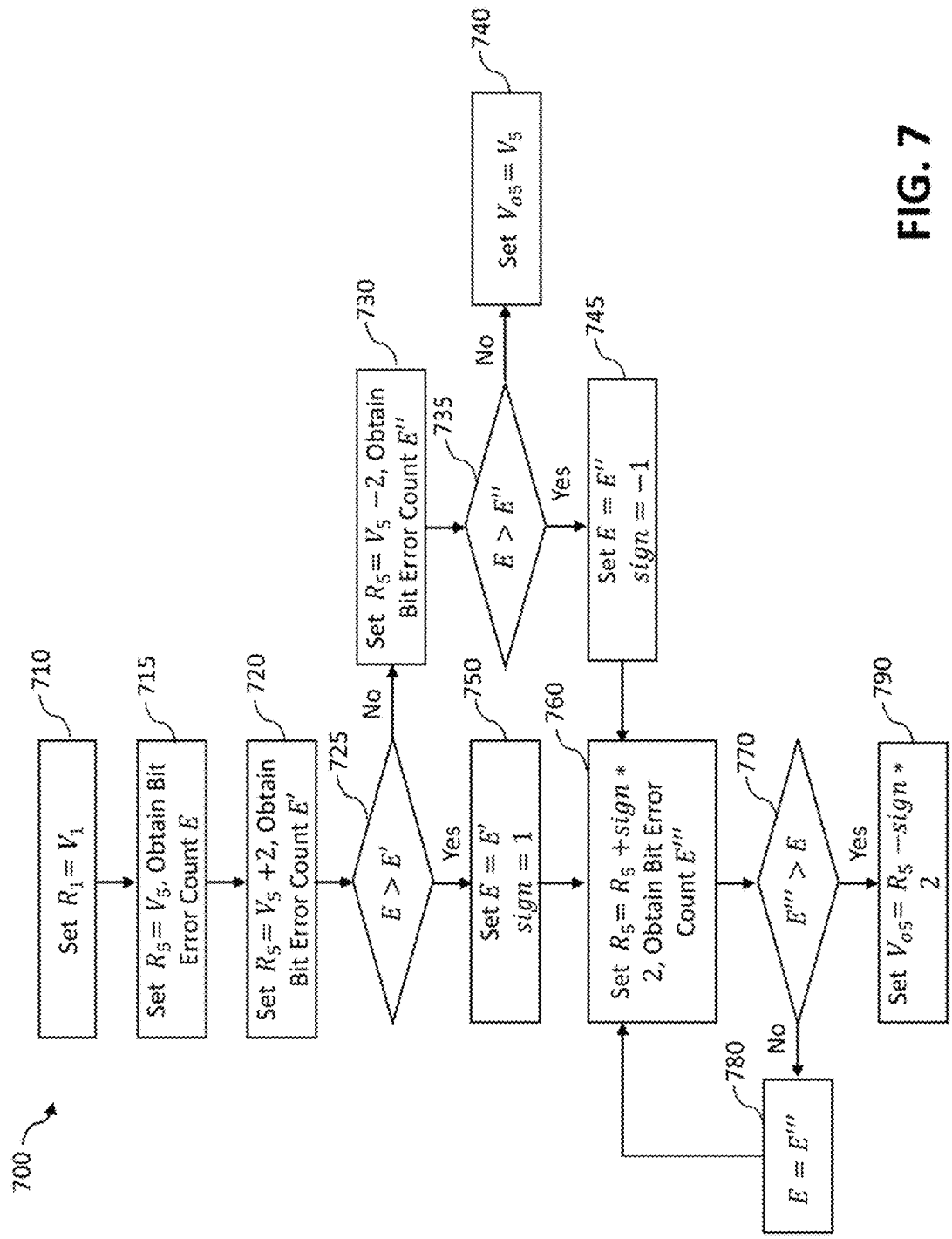
FIG. 7 is a flow chart illustrating an exemplary implementation of a gradient descent process to search for an optimal reference voltage, according to an embodiment of the disclosure.

FIG. 7 is a flow chart illustrating an exemplary implementation of a gradient descent process 700 to search for an optimal reference voltage, such as representative reference voltage $V_{o5}$, according to an embodiment of the disclosure. As noted above, a gradient descent method can optionally be applied during steps 630 and 635 of FIG. 6A to accelerate the searching process.

As shown in FIG. 7, the exemplary gradient descent process 700 initially sets $R_1$ to $V_1$ during step 710. Thereafter, $R_5$ is set to $V_5$, and the bit error count E is obtained during step 715. $R_5$ is then set to $V_5$ plus the step size (e.g., 2), and the corresponding bit error count E' is obtained during step 720.

A test is performed during step 725 to determine if E is greater than E'. If it is determined during step 725 that E is not greater than E', then $R_5$ is then set to $V_5$ minus the step size (e.g., 2) and the corresponding bit error count E" is obtained during step 730.

A test is then performed during step 735 to determine if E is greater than E". If it is determined during step 735 that E is not greater than E", then $V_{o5}$ is set to $V_5$ during step 740.

If it is determined during step 735 that E is greater than E", then E is set E" and a sign variable is set to minus one during step 745, and program control proceeds to step 760.

If it is determined during step 725 that E is greater than E', then E is set E' and the sign variable is set to one during step 750. $R_5$ is then set to $R_5$ plus the sign variable multiplied by the step size (e.g., 2), and the corresponding bit error count E'" is obtained during step 760.

A test is performed during step 770 to determine if E'" is greater than E. If it is determined during step 770 that E'" is not greater than E, then E is set to E'" during step 780, and program control returns to step 760.

If it is determined during step 770 that E'" is greater than E, then $R_5$ is set to $R_5$ minus the sign variable multiplied by the step size (e.g., 2) during step 790. Program control then terminates.

Generating Reference Voltage in Real-Time

Figure 8A:
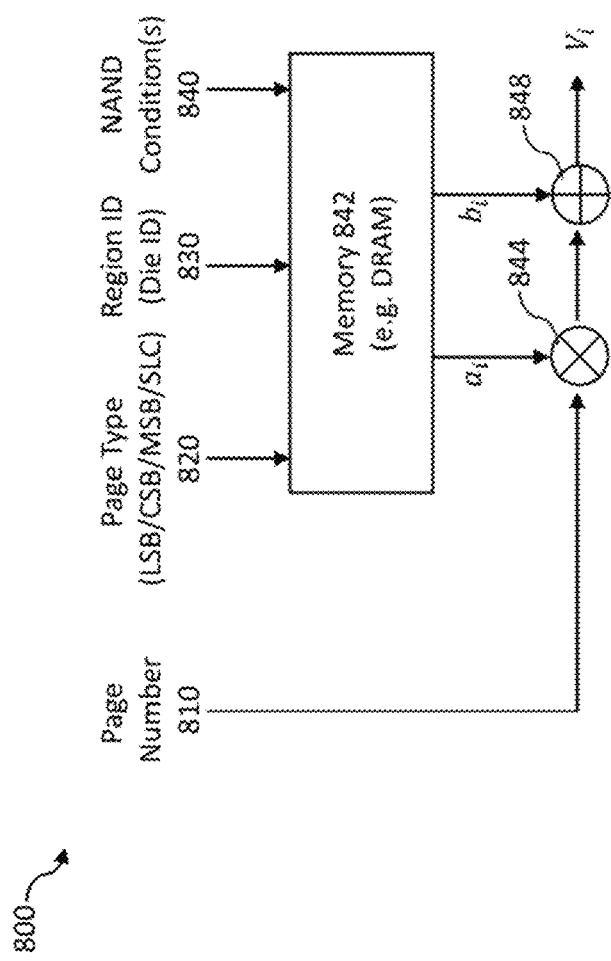

FIG. 8A illustrates an exemplary reference voltage calculator 800 that uses the disclosed page-level reference voltage parameterization techniques for a linear model, according to at least one embodiment of the disclosure. As shown in FIG. 8A, to read a page, the exemplary reference voltage calculator 800 processes the page number 810; page type 820 (e.g., LSB/CSB/MSB/SLC); a region identifier 830 (e.g., a die identifier); and/or one or more NAND conditions 840 (e.g., retention, P/E cycle, program/read temperature, etc.), to read the coefficients $a_i$ and $b_i$ from memory 842 (e.g., a DRAM memory).

As noted above, for each voltage level $R_i$ (i=1, 2, ..., 7), the linear function 420 is represented by the following equation:

$$V_i(P) = a_i*P + b_i,$$

where voltage value $V_i$ is a function of page number P (810), uniquely determined by the two coefficients $a_i$ and $b_i$ that are read from the memory 842 based on the input values 820, 830, 840. The above equation is implemented in FIG. 8A using a multiplier 844 and an adder 848.

The size of the exemplary memory 842 can be analyzed in the following example. Assume that there are four page types (LSB, CSB, MSB, and SLC) and three retention conditions (0~1 day, 1~2 days, and 2+ days), and 128 dies per channel (e.g., number of dies connected on a given bus). It is noted that, in some embodiments, a TLC device can be configured to use the TLC pages as an SLC device. The input of the memory 842 therefore requires two bits for page type 820, two bits for region identifier 830 and seven bits for representation of the NAND condition(s) 840, respectively, which yields in total 11 input bits. Also assume that one byte is used to represent each output coefficient $a_i$ or $b_i$ (i=1, 2, ..., 7). Among all page types (in this example), the maximum number of relevant reference voltage levels is three (for CSB page). This puts the size of the memory output to 3×2=6 bytes. The total size of the required memory 842 is therefore $2^{11} \times 6 = 12K$ bytes, a relatively small size.

FIG. 8B illustrates an exemplary reference voltage calculator 850 that uses the disclosed page-level reference voltage parameterization techniques for an exemplary fourth order polynomial non-linear model, according to at least one embodiment of the disclosure. As shown in FIG. 8B, to read a page, the exemplary reference voltage calculator 850 processes the page number 855; page type 860 (e.g., LSB/CSB/MSB/SLC); a region identifier 865 (e.g., a die identifier); and/or one or more NAND conditions 870 (e.g., retention, P/E cycle, program/read temperature, etc.), to read the coefficients $a_i$, $b_i$, $c_i$, $d_i$, and $e_i$ from memory 875 (e.g., a DRAM memory).

As noted above, for each voltage level $R_i$ (i=1, 2, ..., 7), the non-linear function 520 is represented by the following equation:

$$V_i(P) = a_i*P^4 + b_i*P^3 + c_i*P^2 + d_i*P + e_i,$$

where voltage value $V_i$ is a function of page number P (860), uniquely determined by the coefficients $a_i$, $b_i$, $c_i$, $d_i$, and $e_i$ that are read from the memory 875 based on the input values 860, 865, 870. The above equation is implemented in FIG. 8B using a circuit 880 comprising a multiplier, an adder and 0 block registers, as shown. A 0 block is a register initialized with value '0', that gets updated along the way when algorithm proceeds, in a known manner. Coefficients a, b, c, d, e are applied to the upper register in serial and in the exact order. Thus, at the first clock cycle, the value is set as a, and then changed to b, c, d, e sequentially. The lower 0 block operates in a similar manner, except that the value is updated from a feedback link (out of adder block). Thus, the value would be updated as a, aP+b, aP²+bP+c, aP³+bP²+cP+d, and eventually aP⁴+bP³+cP²+dP+e, which is passed out as the final output. The final output is available after five clock cycles.

The size of the exemplary memory 875 can be analyzed in the following example. Assume that there are four page types (LSB, CSB, MSB, and SLC) and three retention conditions (0~1 day, 1~2 days, and 2+ days), and 128 dies per channel (e.g., number of dies connected on a given bus). It is noted that, in some embodiments, a TLC device can be configured to use the TLC pages as an SLC device. The input of the memory 875 therefore requires two bits for page type 860, two bits for region identifier 865 and seven bits for representation of the NAND condition(s) 870, respectively, which yields in total 11 input bits. Also assume that one byte is used to represent each output coefficient $a_i$, $b_i$, $c_i$, $d_i$, or $e_i$ (i=1, 2, ..., 7) (for the representative fourth order polynomial). Among all page types (in this example), the maximum number of relevant reference voltage levels is three (for CSB page). This puts the size of the memory output to 3×5=15 bytes. The total size of the required memory 875 is therefore $2^{11} \times 15 = 30K$ bytes, a relatively small size.

CONCLUSION

In one or more embodiments of the disclosure, techniques are provided for page-level reference voltage parameterization. It should be understood that the page-level reference voltage parameterization arrangements illustrated in FIGS. 1 through 8 are presented by way of illustrative example only, and should not be construed as limiting in any way. Numerous alternative configurations of system and device elements and associated processing operations can be used in other embodiments.

Illustrative embodiments disclosed herein can provide a number of significant advantages relative to conventional arrangements. For example, one or more embodiments provide a significantly improved codeword failure rate without increasing latency or complexity.

It is to be appreciated that the particular advantages described above and elsewhere herein are associated with particular illustrative embodiments and need not be present in other embodiments. Also, the particular types of page-level reference voltage parameterization features and functionality as illustrated in the drawings and described above are exemplary only, and numerous other arrangements may be used in other embodiments.

As mentioned previously, at least portions of the disclosed page-level reference voltage parameterization system may be implemented using one or more processing platforms. A given such processing platform comprises at least one processing device comprising a processor coupled to a memory. The processor and memory in some embodiments comprise respective processor and memory elements of a virtual machine or container provided using one or more underlying physical machines. The term "processing device" as used herein is intended to be broadly construed so as to encompass a wide variety of different arrangements of physical processors, memories and other device components as well as virtual instances of such components. For example, a "processing device" in some embodiments can comprise or be executed across one or more virtual processors. Processing devices can therefore be physical or virtual and can be executed across one or more physical or virtual processors. It should also be noted that a given virtual device can be mapped to a portion of a physical one.

The disclosed page-level reference voltage parameterization arrangements may be implemented using one or more processing platforms. One or more of the processing modules or other components may therefore each run on a computer, storage device or other processing platform element. A given such element may be viewed as an example of what is more generally referred to herein as a "processing device."

Referring now to FIG. 9, one possible processing platform that may be used to implement at least a portion of one or more embodiments of the disclosure is shown. The processing platform 900 in this embodiment comprises at least a portion of the given system and includes at least one processing device(s), denoted 902-1, 902-2, 902-3, . . . 902-D, which communicate with one another over a network 904. The network 904 may comprise any type of network, such as the Internet, a wireless area network (WAN), a local area network (LAN), a satellite network, a telephone or cable network, a cellular network, a wireless network such as WiFi or WiMAX, or various portions or combinations of these and other types of networks.

The processing device 902-1 in the processing platform 900 comprises a processor 910 coupled to a memory 912. The processor 910 may comprise a microprocessor, a microcontroller, an application specific integrated circuit (ASIC), a field programmable gate array (FPGA) or other type of processing circuitry, as well as portions or combinations of such circuitry elements. The memory 912 may comprise random access memory (RAM), read only memory (ROM) or other types of memory, in any combination. The memory 912 and other memories disclosed herein should be viewed as illustrative examples of what are more generally referred to as "processor-readable storage media" storing executable program code of one or more software programs.

Also included in the processing device 902-1 is network interface circuitry 914, which is used to interface the processing device with the network 904 and other system components, and may comprise conventional transceivers.

The other processing devices 902, if any, of the processing platform 900 are assumed to be configured in a manner similar to that shown for processing device 902-1 in the figure.

Again, the particular processing platform 900 shown in the figure is presented by way of example only, and the given system may include additional or alternative processing platforms, as well as numerous distinct processing platforms in any combination, with each such platform comprising one or more computers, storage devices or other processing devices.

Multiple elements of the system may be collectively implemented on a common processing platform of the type shown in FIG. 9, or each such element may be implemented on a separate processing platform.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Again, the particular processing platform 900 shown in FIG. 9 is presented by way of example only, and the page-level reference voltage parameterization system may include additional or alternative processing platforms, as well as numerous distinct processing platforms in any combination, with each such platform comprising one or more computers, servers, storage devices or other processing devices.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the page-level reference voltage parameterization system. Such components can communicate with other elements of the page-level reference voltage parameterization system over any type of network or other communication media.

As indicated previously, components of an information processing system as disclosed herein can be implemented at least in part in the form of one or more software programs stored in memory and executed by a processor of a processing device. For example, at least portions of the functionality of the linear function coefficients calibration processes 600 and 650 of FIGS. 6A and 6B and/or the gradient descent process 700 of FIG. 7 are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems and page-level reference voltage parameterization systems. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A method, comprising:
   obtaining a bit error count for a plurality of page numbers across a plurality of blocks of a solid state memory device;
   determining a substantially optimal reference voltage for each page number that substantially minimizes a corresponding bit error count;
   collecting, for each reference voltage, page numbers and corresponding substantially optimal reference voltages; and
   determining, for each reference voltage, a non-linear function that substantially fits a distribution of the collected page numbers and corresponding substantially optimal reference voltages,
   wherein a given page having a given page number is read by employing a plurality of parameters of the non-linear function to generate the substantially optimal reference voltage for the given page number.

2. The method of claim 1, wherein the determining step is performed for a unit comprising one or more codewords with a same page number across one or more blocks, wherein each unit corresponds to a same page number.

3. The method of claim 1, wherein the plurality of parameters of the non-linear function are stored in a memory for each page number.

4. The method of claim 1, wherein the non-linear function comprises one or more of a polynomial function, an exponential function and a logarithmic function.

5. The method of claim 1, wherein the parameters of the non-linear function comprise the coefficients of the non-linear function.

6. The method of claim 1, wherein the parameters of the non-linear function are computed as a function of one or more of retention time, number of program/erase cycles, number of read cycles, temperature, temperature changes, page type and location within the solid state memory device.

7. The method of claim 1, further comprising the step of updating the parameters of the non-linear function over time.

8. The method of claim 1, wherein the given page having the given page number is read using the plurality of parameters of the non-linear function to generate the substantially optimal reference voltage for the given page number, and wherein at least one additional page having a corresponding page number is read using a mean value for the substantially optimal reference voltage for the corresponding page number of the at least one additional page.

9. The method of claim 1, wherein the step of collecting, for each reference voltage, the page numbers and the corresponding substantially optimal reference voltages further comprises the step of collecting only the page numbers and the corresponding substantially optimal reference voltages having the corresponding bit error count that satisfies one or more predefined outlier criteria.

10. A tangible machine-readable recordable storage medium, wherein one or more software programs when executed by one or more processing devices implement the steps of the method of claim 1.

11. An apparatus, comprising:
    a memory; and
    at least one processing device, coupled to the memory, operative to implement the following steps:
    obtaining a bit error count for a plurality of page numbers across a plurality of blocks of a solid state memory device;
    determining a substantially optimal reference voltage for each page number that substantially minimizes a corresponding bit error count;
    collecting, for each reference voltage, page numbers and corresponding substantially optimal reference voltages; and
    determining, for each reference voltage, a non-linear function that substantially fits a distribution of the collected page numbers and corresponding substantially optimal reference voltages,
    wherein a given page having a given page number is read by employing a plurality of parameters of the non-linear function to generate the substantially optimal reference voltage for the given page number.

12. The apparatus of claim 11, wherein the determining step is performed for a unit comprising one or more codewords with a same page number across one or more blocks, wherein each unit corresponds to a same page number.

13. The apparatus of claim 11, wherein the plurality of parameters of the non-linear function are stored in a memory for each page number.

14. The apparatus of claim 11, wherein the non-linear function comprises one or more of a polynomial function, an exponential function and a logarithmic function.

15. The apparatus of claim 11, wherein the parameters of the non-linear function comprise the coefficients of the non-linear function.

16. The apparatus of claim 11, wherein the parameters of the non-linear function are computed as a function of one or more of retention time, number of program/erase cycles, number of read cycles, temperature, temperature changes, page type and location within the solid state memory device.

17. The apparatus of claim 11, wherein the given page having the given page number is read using the plurality of parameters of the non-linear function to generate the substantially optimal reference voltage for the given page number, and wherein at least one additional page having a corresponding page number is read using a mean value for the substantially optimal reference voltage for the corresponding page number of the at least one additional page.

18. The apparatus of claim 11, wherein the step of collecting, for each reference voltage, the page numbers and the corresponding substantially optimal reference voltages further comprises the step of collecting only the page numbers and the corresponding substantially optimal reference voltages having the corresponding bit error count that satisfies one or more predefined outlier criteria.

19. A storage controller comprising the apparatus of claim 11.

20. A device comprising:
a controller configured to perform the following steps:
obtaining a bit error count for a plurality of page numbers across a plurality of blocks of a solid state memory device;
determining a substantially optimal reference voltage for each page number that substantially minimizes a corresponding bit error count;
collecting, for each reference voltage, page numbers and corresponding substantially optimal reference voltages; and
determining, for each reference voltage, a non-linear function that substantially fits a distribution of the collected page numbers and corresponding substantially optimal reference voltages,
wherein a given page having a given page number is read by employing a plurality of parameters of the non-linear function to generate the substantially optimal reference voltage for the given page number.

* * * * *

UNITED STATES PATENT AND TRADEMARK OFFICE
CERTIFICATE OF CORRECTION

PATENT NO. : 10,490,288 B1
APPLICATION NO. : 16/144655
DATED : November 26, 2019
INVENTOR(S) : Zheng Wang et al.

Page 1 of 1

It is certified that error appears in the above-identified patent and that said Letters Patent is hereby corrected as shown below:

On the Title Page

Item (54) and in the Specification at Column 1, Lines 1-3 replace, "Page-Level Reference Voltage Parameterization For Solid Statesolid State Storage Devices" with --Page-Level Reference Voltage Parameterization For Solid State Storage Devices--

Signed and Sealed this
Fifth Day of May, 2020

Andrei Iancu
*Director of the United States Patent and Trademark Office*